(12) United States Patent
Gaal

(10) Patent No.: US 10,401,581 B2
(45) Date of Patent: Sep. 3, 2019

(54) OPTICAL MODULE HEATSINK LIFTER AND METHOD

(71) Applicant: Ciena Corporation, Hanover, MD (US)

(72) Inventor: Adrianus Van Gaal, Ottawa (CA)

(73) Assignee: Ciena Corporation, Hanover, MD (US)

( * ) Notice: Subject to any disclaimer, the term of this patent is extended or adjusted under 35 U.S.C. 154(b) by 327 days.

(21) Appl. No.: 15/072,863

(22) Filed: Mar. 17, 2016

(65) Prior Publication Data

US 2017/0269314 A1  Sep. 21, 2017

(51) Int. Cl.
*G02B 6/42* (2006.01)
*H05K 7/20* (2006.01)

(52) U.S. Cl.
CPC ......... *G02B 6/4269* (2013.01); *G02B 6/4261* (2013.01); *H05K 7/20154* (2013.01); *H05K 7/20472* (2013.01); *H05K 7/20563* (2013.01)

(58) Field of Classification Search
CPC .................................................... G02B 6/4269
See application file for complete search history.

(56) References Cited

U.S. PATENT DOCUMENTS

| | | | |
|---|---|---|---|
| 2003/0161108 A1* | 8/2003 | Bright | G02B 6/4201 361/707 |
| 2014/0321061 A1 | 10/2014 | Moore et al. | |
| 2015/0092354 A1* | 4/2015 | Kelty | H05K 7/20563 361/722 |

* cited by examiner

*Primary Examiner* — Sung H Pak
*Assistant Examiner* — Hoang Q Tran
(74) *Attorney, Agent, or Firm* — Clements Bernard Walker PLLC; Christopher L. Bernard; Lawrence A. Baratta, Jr.

(57) ABSTRACT

A module heatsink lifter for raising and lowering a heatsink enabling insertion and removal of a module includes a fixed base; a hinge connector of the fixed based coupled to the heatsink; and an actuator mechanism to raise and lower the heatsink through rotation about the hinge connector, wherein the actuator mechanism operates from a front faceplate based on push and pull movement to raise and lower the heatsink into a raised position and a lowered position. The heatsink includes a Thermal Interface Material (TIM) on a bottom portion which creates a thermal connection with the module when the heatsink is in the lowered position. The module can include a pluggable optical module.

20 Claims, 8 Drawing Sheets

OPTICAL MODULE HEATSINK LIFTER AND METHOD

FIELD OF THE DISCLOSURE

The present disclosure generally relates to networking hardware systems and methods. More particularly, the present disclosure relates to an optical module heatsink lifter and method, such as for use with pluggable optical modules or the like.

BACKGROUND OF THE DISCLOSURE

In networking equipment, such as routers, switches, cross-connects, Wavelength Division Multiplexing (WDM) terminals, and the like, pluggable optical transceivers are used for optical port connectivity. Exemplary pluggable optical transceivers include XFP, XPAK, XENPAK, X2, XFP-E, SFP, SFP+, 300-pin, CFP, CFP2, CFP4, QSFP, QSFP28, etc. Networking equipment including the optical transceivers is typically rated to operate in extended temperature ranges such as −40° C. to +85° C. Emerging small form factor packages for 100 Gb/s and higher optical modules, such as CFP4 (C Small Form Factor Pluggable 4), QSFP (Quad Small Form Factor Pluggable), and the like, are only available in limited temperature ranges such as 0° C. to +70° C. Thus, use of these small form factor packages would limit the overall temperature range of networking hardware. To assist with operation at higher temperatures, heatsinks may be used with the pluggable optical transceiver. However, since the pluggable optical transceiver is selectively inserted and removed through a slot in a device, conventional heatsinks rely on metal-to-metal contact between the pluggable optical transceiver and a slot in the device. Of course, metal-to-metal contact does not provide a uniform or efficient thermal transfer between devices. It would be advantageous to include a Thermal Interface Material (TIM) between the heatsink and the pluggable optical transceiver, but this material would "get in the way" during insertion and removal of the pluggable optical transceiver (note, as described herein a transceiver is also a module).

BRIEF SUMMARY OF THE DISCLOSURE

In an exemplary embodiment, a module heatsink lifter for raising and lowering a heatsink enabling insertion and removal of a module includes a fixed base; a hinge connector of the fixed based coupled to the heatsink; and an actuator mechanism to raise and lower the heatsink through rotation about the hinge connector, wherein the actuator mechanism operates from a front faceplate based on push and pull movement to raise and lower the heatsink into a raised position and a lowered position. The actuator mechanism can include a knob through the front faceplate used for the push and pull movement. The actuator mechanism can include a knob coupled to lever arms on both sides of the heatsink; linkage arms rotatably coupling the lever arms to the base; and springs on the both sides providing tension between posts and the heatsink. The actuator mechanism can hold the heatsink in the raised position without requiring a force on a knob through the front faceplate used for the push and pull movement. The module can include a pluggable optical module. When the heatsink is in the lowered position, the heatsink prevents insertion or removal of the module, and wherein the heatsink is moved to the raised position for the insertion or removal of the module. The heatsink can include a Thermal Interface Material (TIM) on a bottom portion which creates a thermal connection with the module when the heatsink is in the lowered position.

In another exemplary embodiment, a heatsink lifter method for raising and lowering a heatsink enabling insertion and removal of a module includes providing a fixed base; providing a hinge connector of the fixed based coupled to the heatsink; and providing an actuator mechanism to raise and lower the heatsink through rotation about the hinge connector, wherein the actuator mechanism operates from a front faceplate based on push and pull movement to raise and lower the heatsink into a raised position and a lowered position. The actuator mechanism can include a knob through the front faceplate used for the push and pull movement. The actuator mechanism can include a knob coupled to lever arms on both sides of the heatsink; linkage arms rotatably coupling the lever arms to the base; and springs on the both sides providing tension between posts and the heatsink. The actuator mechanism can hold the heatsink in the raised position without requiring a force on a knob through the front faceplate used for the push and pull movement. The module can include a pluggable optical module. When the heatsink is in the lowered position, the heatsink prevents insertion or removal of the module, and wherein the heatsink is moved to the raised position for the insertion or removal of the module. The heatsink can include a Thermal Interface Material (TIM) on a bottom portion which creates a thermal connection with the module when the heatsink is in the lowered position.

In a further exemplary embodiment, a network element supporting one or more pluggable modules includes a physical housing including a front faceplate; one or more ports on the front faceplate; and a heatsink lifter for each of the one or more ports, wherein the heatsink lifter includes a fixed base, a hinge connector of the fixed based coupled to the heatsink, and an actuator mechanism to raise and lower the heatsink through rotation about the hinge connector, wherein the actuator mechanism operates from the front faceplate based on push and pull movement to raise and lower the heatsink into a raised position and a lowered position. The actuator mechanism can include a knob through the front faceplate used for the push and pull movement. The actuator mechanism can include a knob coupled to lever arms on both sides of the heatsink; linkage arms rotatably coupling the lever arms to the base; and springs on the both sides providing tension between posts and the heatsink. The module can include a pluggable optical module. When the heatsink is in the lowered position, the heatsink prevents insertion or removal of the module, and wherein the heatsink is moved to the raised position for the insertion or removal of the module. The heatsink can include Thermal Interface Material (TIM) on a bottom portion which creates a thermal connection with the module when the heatsink is in the lowered position.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, in various exemplary embodiments, the present disclosure relates to an optical module heatsink lifter and method. Specifically, the optical module heatsink lifter and method provides a mechanism to lift a heatsink located behind a faceplate of a device, such as a network element. This allows an optics module to be installed (e.g., a pluggable optical transceiver), with the heatsink raised. After the optics module is installed, the heatsink can be lowered into position. Such a mechanism allows the heatsink to have a Thermal Interface Material (TIM) thereon that makes substantial contact with the optics module for improved thermal transfer. Importantly, the mechanism is all via front access avoiding rear, side, top, and bottom access to the associated network element for increased rack space efficiency. The mechanism includes a both a linkage arm and lever arm on both sides of the heatsink. At the back of the heatsink (front is faceplate end) the heatsink has a hinge point. A spring is located on either side of the heatsink between the lever arm and the hinge point. A coupling is used to connect the two lever arms with a single actuator that passes through the faceplate (the faceplate is on the front of the network element where all user access occurs). The heatsink is designed so when the heatsink is in the down position, without an optics module the heatsink will block the installation of the optics module. The optics module can only be installed when the heatsink is raised. Lever arms are designed so when the heatsink is in the raised position; the three pivot points are in a line so the heatsink will stay in the raised position without holding the actuator. It can also be designed to allow the actuator to go past the alignment point, causing the actuator to be pushed forward by the springs, and stop against the faceplate.

The optical module heatsink lifter and method solves the issue of poor conductivity in conventional heatsinks for pluggable optical modules due to a lack of TIM. Lifting the heatsink during the module installation, and using a TIM with a thin film to prevent adhesion allows for a significant improvement in the thermal resistance between the heatsink and module. The way it addresses the issue of lifting allows a significant mechanical advantage and minimal friction.

Figure 1:
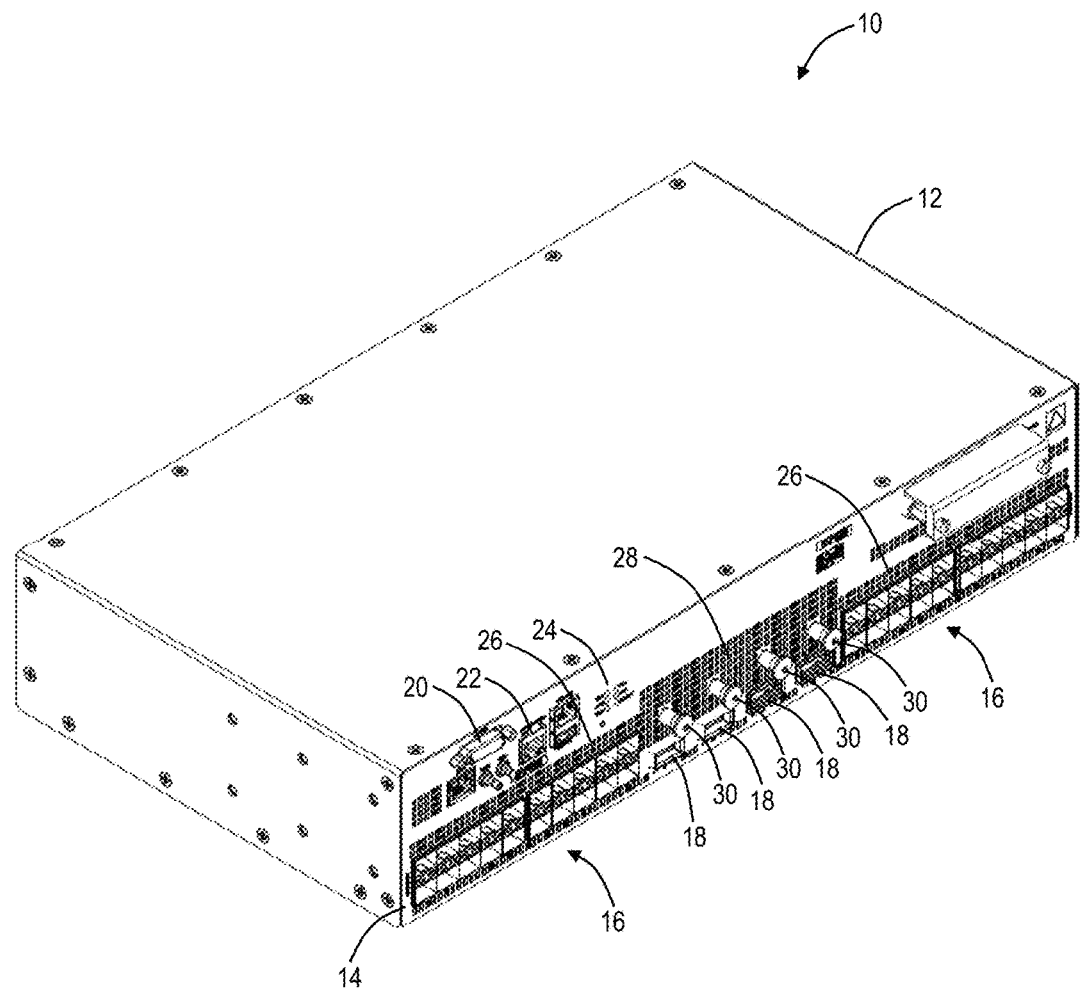
FIG. 1 is a perspective diagram of a network element for describing the multi-directional fan systems and methods.

Referring to FIG. 1, in an exemplary embodiment, a perspective diagram illustrates a network element 10 for describing the optical module heatsink lifter and method. The network element 10 is, for example, a 2 Rack Unit (RU) chassis with a physical housing 12 adapted to mount in a rack or frame. Note, other sizes besides 2RU are also contemplated by the systems and methods. In various exemplary embodiments, the network element 10 can be a switch, router, aggregation device, Multi-Service Provisioning Platform (MSPP), or the like. For example, a front faceplate 14 of the physical housing 12 can include various ports 16, 18 for connectivity. The front faceplate 14 can also include Operations, Administration, Maintenance, and Provisioning (OAM&P) ports such as a serial interface 20, an Ethernet port 22, status indicators 24 (such as Light Emitting Diodes), and the like. Additionally, the front faceplate 14 can include air intake openings 26, 28. In the exemplary network element 10, airflow is from front to back, via the openings 26, 28. For example, the openings 26 can provide airflow over the ports 16 and associated components and the openings 28 can provide airflow over the ports 18 and associated components.

In the example of FIG. 1, the ports 16 are for low-speed optical interconnection via pluggable optical transceivers such as XFPs (10 Gigabit Small Form Factor Pluggable) or the like. The pluggable optical transceivers associated with the ports 16 are small form factor modules and can, for example, operate in the extended temperature range. The ports 18 are for high-speed optical interconnections such as small form factor 100 Gb/s and above. In an exemplary embodiment, the ports 18 support CFP4 or QSFP compliant modules. Disadvantageously, the high-speed optical interconnections in the ports 18 do not support extended temperature range, i.e., these small form factor modules (e.g., CFP4, QSFP, etc.) support a limited temperature range. As such, the network element 10, without the systems and methods, is constrained to operate in the limited temperature range only due to the presence of these modules in the port 18. Accordingly, the objective of the systems and methods is to enable extended temperature range operation of the small form factor modules in the ports 18 through a heatsink with TIM that is selectively raised and lowered using a knob 30 for each of the ports 18. The heatsink is raised/lowered by pulling/pushing the knob 30. When the heatsink is raised, the pluggable optical module can be inserted; then the heatsink is lowered, making contact with the pluggable optical module through the TIM.

Those of ordinary skill in the art will recognize the network element 10 is described for illustration purposes of the optical module heatsink lifter and method. Those of ordinary skill in the art will recognize the optical module heatsink lifter and method contemplate any network element or chassis where it is desired to support better heatsink thermal connectivity with pluggable optical modules, using a mechanism that solely relies on front faceplate access. The optical module heatsink lifter and method can extend the temperature range operation for modules in the ports 18. Accordingly, small form factor high-speed optical transceivers (e.g., CFP4, QSFP, etc.), in the port 18, are one such example.

Figure 2:
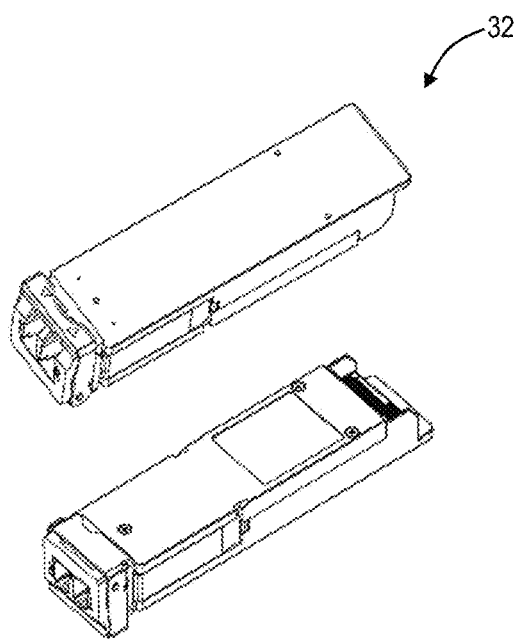
FIG. 2 is a perspective diagram of a CFP4 module.
Figure 3:
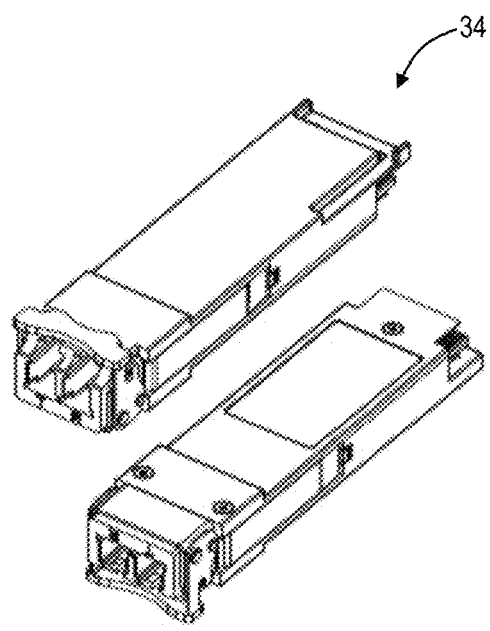
FIG. 3 is a perspective diagram of a QSFP module.
Figure 4:
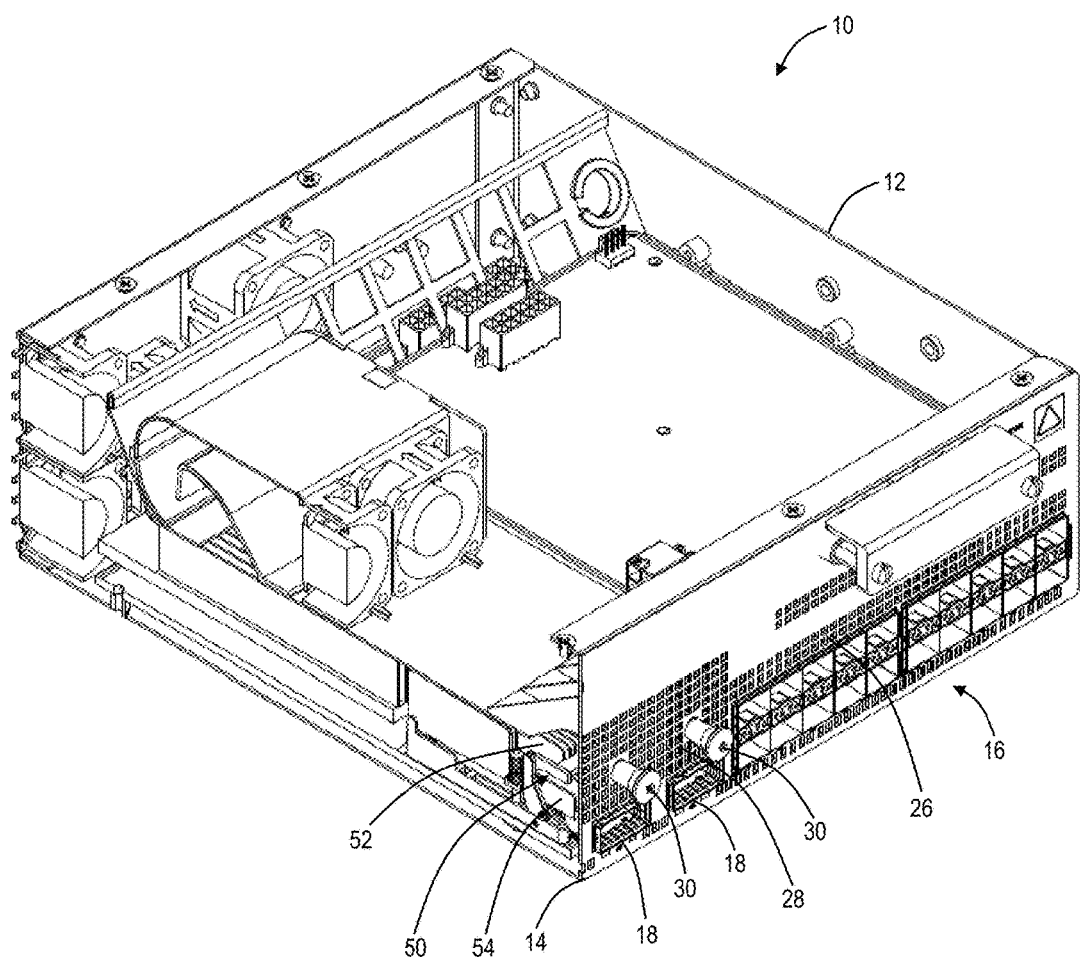
FIG. 4 is a perspective diagram of an interior, cross-sectional view of the network element of FIG. 1 for describing the optical module heatsink lifter and method.

Referring to FIGS. 2 and 3, in an exemplary embodiment, perspective diagrams illustrate a CFP4 module 32 (FIG. 2), and a QSFP module 34 (FIG. 4). The CFP4 module 32 or the QSFP module 34 can be selectively plugged into the ports 18. Note, if the heatsink inside the port 18 included the TIM, the TIM would wear, bunch up, etc. as the modules 32, 34 are inserted. The CFP Multi-Source Agreement (MSA) defines hot-pluggable optical transceiver form factors to enable 40 Gb/s and 100 Gb/s applications, including next-generation High-Speed Ethernet (40 GbE and 100 GbE).

Pluggable CFP, CFP2 and CFP4 transceivers support the ultra-high bandwidth requirements of data communications and telecommunication networks that form the backbone of the internet. CFP4 is defined by the CFP MSA in "CFP4 Hardware Specification," Revision 1.1, 18 Mar. 2015, available online at www.cfp-msa.org/Documents/CFP-MSA_CFP4_HW-Spec-rev1.1.pdf, the contents of which are incorporated by reference herein. Other, emerging variants of CFP are also contemplated by the CFP4 module 32.

The QSFP module 34 is a compact, hot-pluggable transceiver used for data communications applications which interface networking hardware to a fiber optic cable or active or passive electrical copper connection. The QSFP module 34 provides data rates from 4×10 Gb/s as well as higher data rates; as of May 2013, the highest possible rate is 4×28 Gb/s (also known as QSFP28). QSFP is defined by the SFF committee in SFF-8635 "QSFP+4×10 Gb/s Pluggable Transceiver Solution (QSFP10)," Rev. 0.6, 29 Jun. 2015, and SFF-8665 "QSFP+28 Gb/s 4× Pluggable Transceiver Solution (QSFP28)," Rev. 1.9, 29 Jun. 2015, the contents of each is incorporated by reference herein. Other, emerging variants of QSFP are also contemplated herein for the QSFP module 34. The QSFP specification accommodates Ethernet, Fibre Channel, InfiniBand and SONET/SDH standards with different data rate options. QSFP+ transceivers are designed to carry Serial Attached SCSI, 40G Ethernet (100G using QSFP28), QDR (40G) and FDR (56G) Infiniband, and other communications standards. QSFP modules increase the port density by 3×-4× compared to SFP+ modules.

Of course, while the CFP4 module 32 and the QSFP module 34 are described herein, those of ordinary skill in the art will recognize the optical module heatsink lifter and method contemplate operation with any type of pluggable module.

Figure 5:
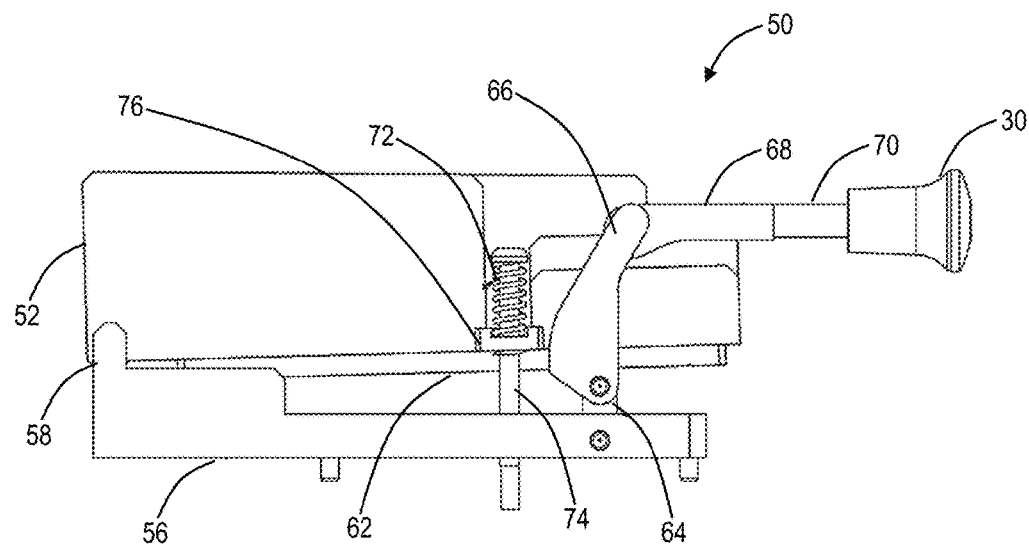
FIG. 5 is a side view of the heatsink lifter in a raised position.

Referring to FIG. 4, in an exemplary embodiment, a perspective diagram illustrates an interior, cross-sectional view of the network element 10 for describing the optical module heatsink lifter and method. Specifically, FIG. 5 illustrates the right side of the network element 10 from FIG. 1 with the top cover removed and the view illustrating half of the network element 10. Each knob 30 on the front faceplate 14 is coupled to a heatsink lifter 50 located within the network element 10. The heatsink lifter 50 is connected to a heatsink 52 and adapted to raise the heatsink 52, via the knob 30 at the front faceplate 14, to insert a module 54 and to lower the heatsink 52, again via the knob 30, to engage the heatsink 52 with TIM to the module 54. Again, in an exemplary embodiment, the module 54 is a pluggable optical transceiver, such as CFP4, QSFP, or the like.

Figure 6:
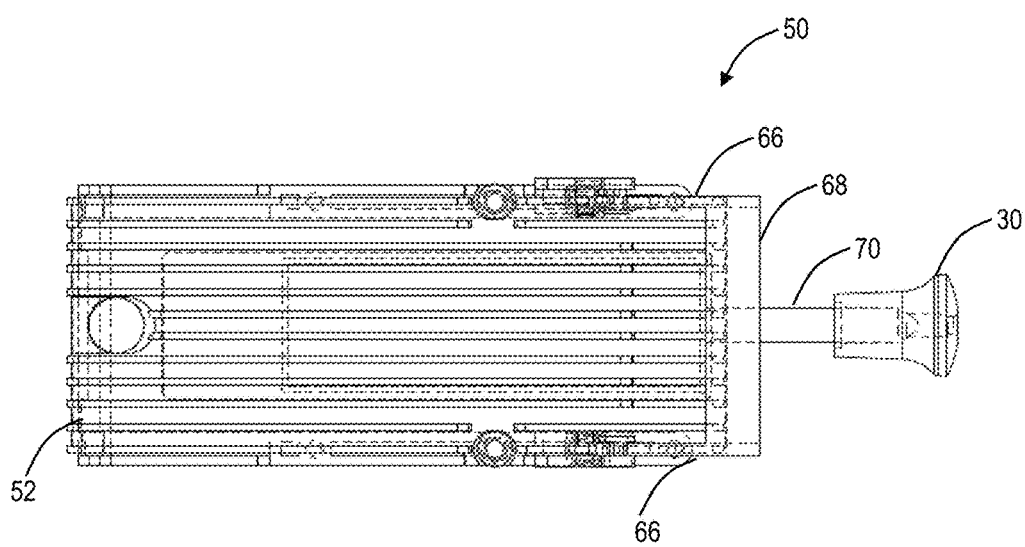
FIG. 6 is a top view of the heatsink lifter in the raised position.
Figure 7:
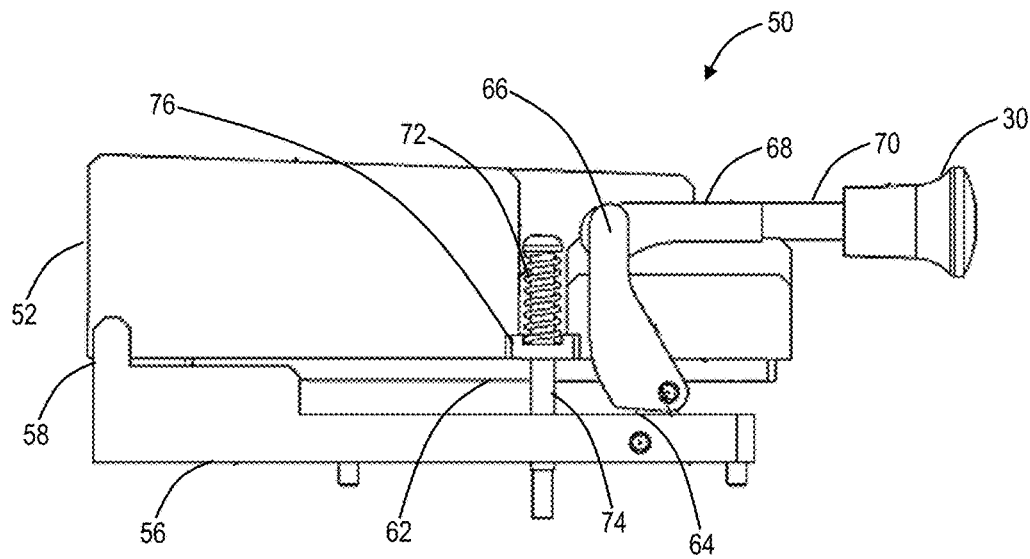
FIG. 7 is a side view of the heatsink lifter in a lowered position.
Figure 8:
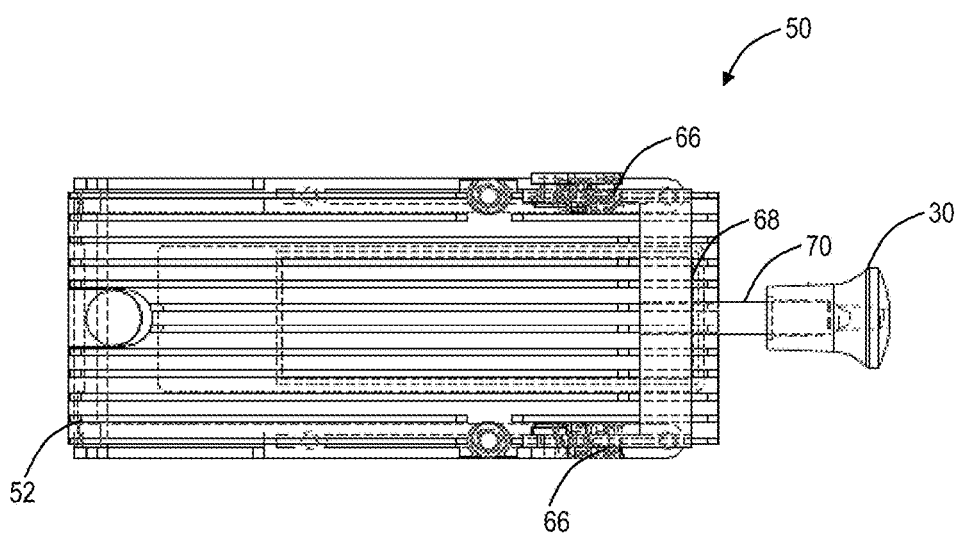
FIG. 8 is a top view of the heatsink lifter in the lowered position.
Figure 9:
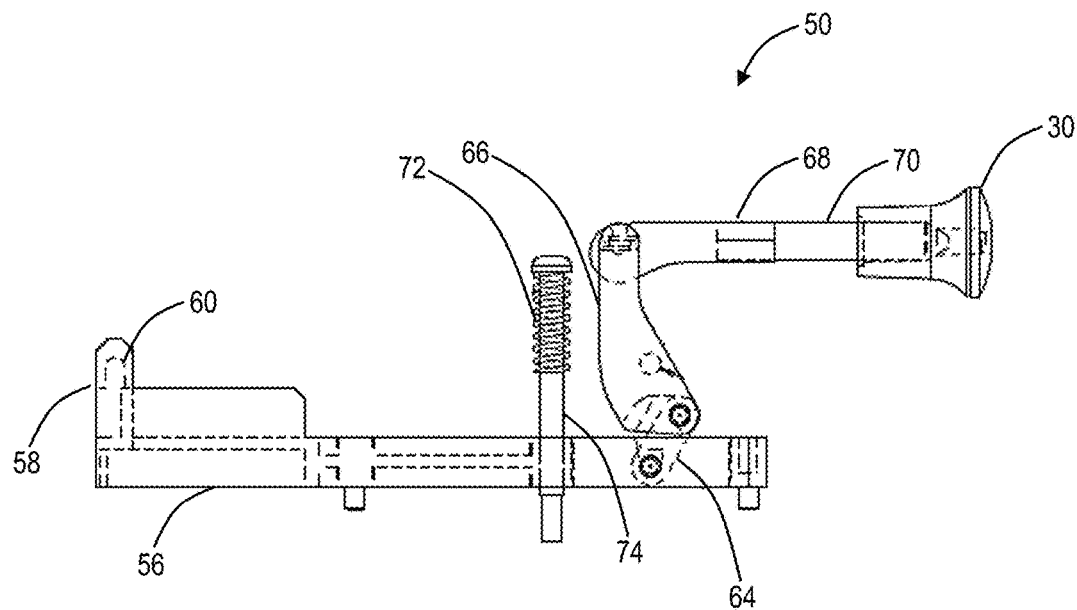
FIG. 9 is a side view of the heatsink lifter with the heatsink omitted for illustration purposes.
Figure 10:
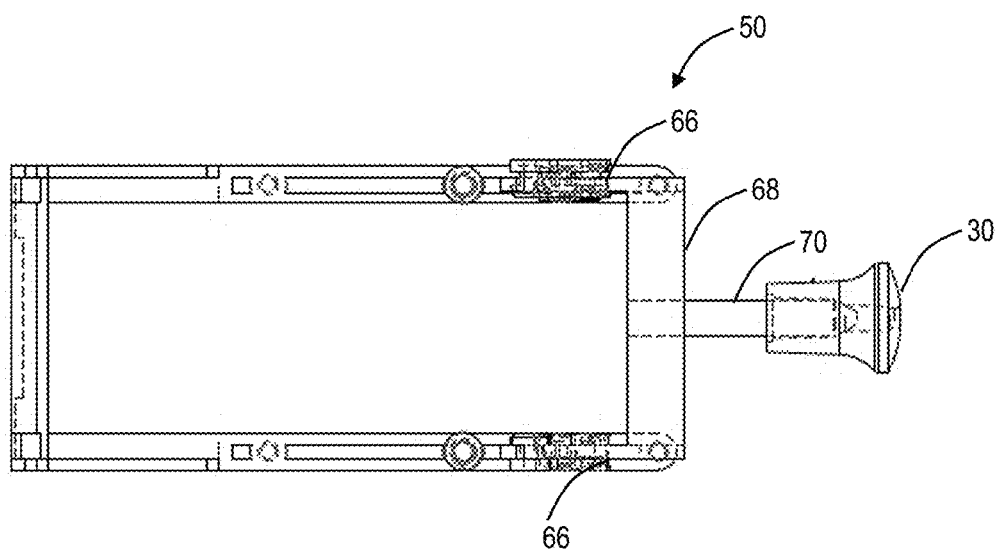
FIG. 10 is a top view of the heatsink lifter with the heatsink omitted for illustration purposes.
Figure 11:
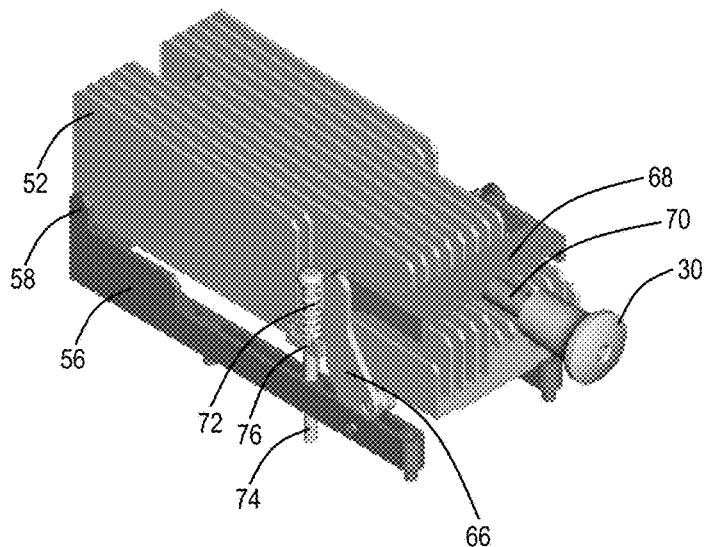
FIG. 11 is a perspective view of the heatsink lifter in a raised position.
Figure 12:
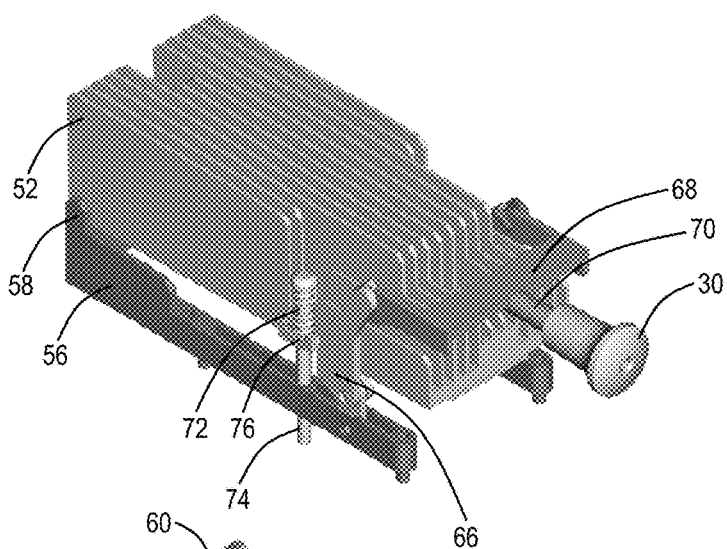
FIG. 12 is a perspective view of the heatsink lifter in a lowered position.
Figure 13:
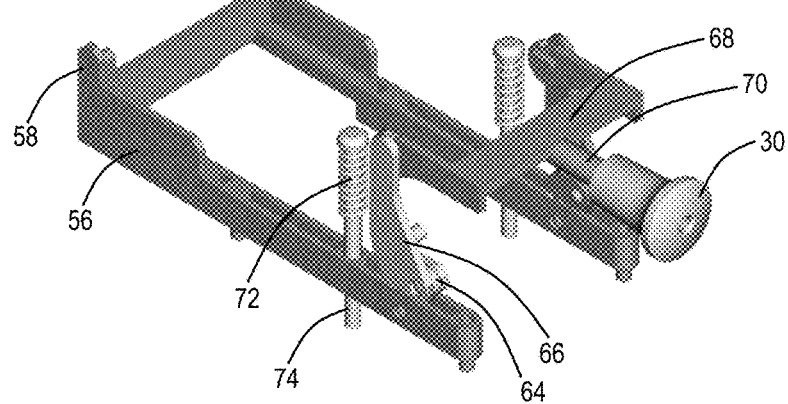
FIG. 13 is a perspective view of the heatsink lifter with the heatsink omitted for illustration purposes.

Referring to FIGS. 5-13, in various exemplary embodiments, various diagrams illustrate the heatsink lifter 50 with associated components in both a raised and a lowered position. FIG. 5 is a side view of the heatsink lifter 50 in a raised position and FIG. 6 is a top view of the heatsink lifter 50 in the raised position. FIG. 7 is a side view of the heatsink lifter 50 in a lowered position and FIG. 8 is a top view of the heatsink lifter in the lowered position. FIG. 9 is a side view of the heatsink lifter 50 with the heatsink 52 omitted for illustration purposes, and FIG. 10 is a top view of the heatsink lifter 50 with the heatsink 52 omitted for illustration purposes. FIG. 11 is a perspective view of the heatsink lifter 50 in a raised position, FIG. 12 is a perspective view of the heatsink lifter 50 in a lowered position, and FIG. 13 is a perspective view of the heatsink lifter 50 with the heatsink 52 omitted for illustration purposes.

The heatsink lifter 50 includes a base 56 which is fixed and includes a hinge connector 58 with a rotatable connection to the heatsink 52. The base 56 is fixed to a Printed Circuit Board (PCB) or the like internal to the network element 10. There can be the heatsink lifter 50 for each port 18. There are also interconnections in the port 18 for electrically engaging the module 54. The heatsink lifter 50 is between the port 18 and the interconnections.

The hinge connector 58 is located at one end of the base 56, and the heatsink 52 is adapted to rotate about the hinge connector 58. For example, the hinge connector 58 can include a curved notch 60 that physically engages a corresponding opening in the heatsink 52. This engagement enables the heatsink 52 to rotate about the hinge connector 58. Also, the arrangement of the hinge connector 58, the notch 60, and the heatsink 52 enables limited rotation of the heatsink 52, such as no more than 10° or 20°, since only a moderate amount of an opening is required inside the heatsink lifter 50 to allow the module 54 to be plugged into the port 18, without touching the heatsink 52 and thus risking problems with a Thermal Interface Material (TIM) 62 on the heatsink 52.

The TIM 62 is located underneath, across a bottom portion of the heatsink 52. Again, for metal to metal contact between the heatsink 52 and the module 54, standard machined surfaces are rough and wavy, leading to relatively few actual contact points between surfaces, leading to poor thermal conductance therebetween. The insulating air gaps created by multiple voids of "contacting" hard surfaces are too large a thermal barrier for even modest power applications. The purpose of the TIM 62, when the heatsink 52 is in the lowered position, is to improve thermal contact between the heatsink 52 and the module 54. The TIM 62 contemplates any type of thermally conducting material, such as elastomeric pads, phase change materials, adhesives, gels, grease, polymers, etc.

The knob 30 is adapted to control the rotation about the hinge connector 58. Note, an important aspect of the heatsink lifter 50 is that it only requires front access at the faceplate 14 and minimizes real estate, i.e., it does not move up and down as that would take up additional space on the faceplate 14. Thus, the knob 30 operates through push and pull movement to cause rotation of the heatsink 52 about the hinge connector 58, through a mechanism that includes a linkage arm 64 and a lever arm 66 on both sides of the heatsink 52. That is, there are right and left linkage arms 64 and right and left lever arms 66 on each side of the heatsink 52.

Each of the right and left lever arms 66 rotatably connects to a coupling 68 which includes a rod 70 connected to the knob 30. Thus, push and pull movement of the knob 30 translates to a rotational force on the right and left lever arms 66 via the coupling 68. The right and left linkage arms 64 are rotatably connected to the base 56, such as through hinge connections.

Springs 72 are located on a post 74 on both sides of the heatsink 52 (i.e., left and right springs 72 and left and right posts 74) between the lever arms 66 and the hinge connector 58. The post 74 extends through a flange 76 disposed to the heatsink 52. The springs 72 provide tension to the flange 76 and the heatsink 52.

In FIG. 5, the knob 30 is pulled in an out position, resulting in the heatsink 52 being in the raised position. The linkage arms 64 are substantially vertical, the lever arms 66 are tilted slightly to the right, and the springs 72 are compressed providing tension between the heatsink 52 and the post 74. In FIG. 7, the knob 30 is pushed into an in position, resulting in the heatsink 52 being in the lowered position. The linkage arms 64 are tilted to the right, the lever arms 66 are tilted slightly to the left, and the springs 72 are relaxed from the compression, relieving the tension.

The heatsink 52 is designed so when the heatsink 52 is in the lowered position (i.e., down), without the module 54 included, the heatsink 52 will block the installation of the module 54 The module 54 can only be installed when the heatsink 52 is in the raised position. This allows the TIM 62 on the heatsink 52 protection during insertion of the module 54, i.e., the module 54 can only be inserted/removed from the port 18 when the heatsink 52 is in the raised position. The lever arms 66 are designed so when the heatsink 52 is in the raised position; the three pivot points are in a line so the heatsink 52 will stay in the raised position without holding the knob 30 (i.e., an actuator). The lever arms 66 can also be designed to allow the actuator to go past the alignment point, causing the actuator to be pushed forward by the springs 72, and stop against the faceplate 14.

Figure 14:
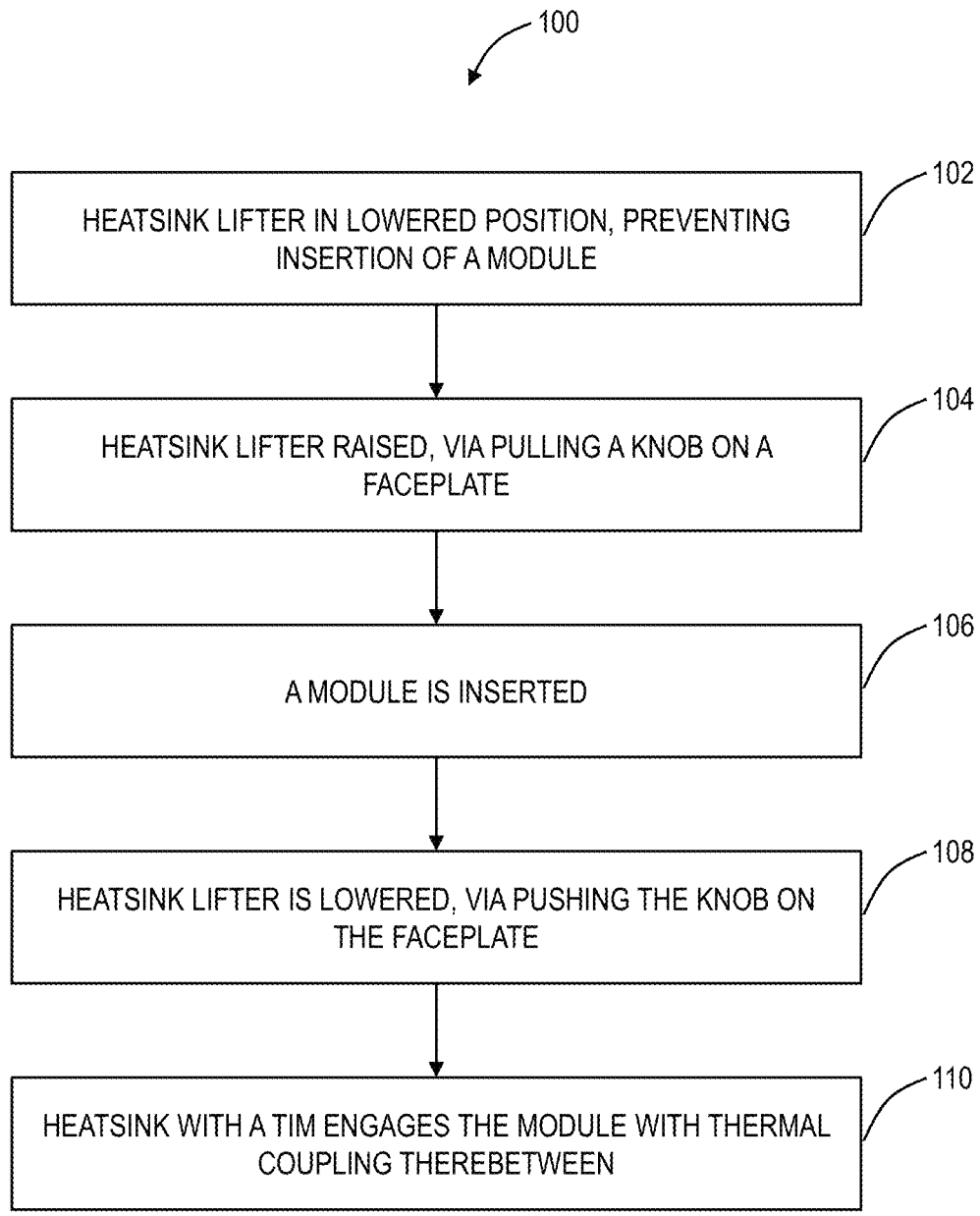
FIG. 14 is a flowchart of an optical module heatsink lifter process.

Referring to FIG. 14, in an exemplary embodiment, a flowchart illustrates an optical module heatsink lifter process 100. Note, conventionally, a pluggable optical module was inserted/removed from the port 18. The optical module heatsink lifter process 100 includes additional steps of raising the heatsink 52 prior to insertion of the module 54 and lowering of the heatsink 52 subsequent to insertion of the module 54. In this manner, the heatsink 52 can include the TIM 62 which physically is located between the heatsink 52 and the module 54 and is protected during removal/insertion of the module 54.

The optical module heatsink lifter process 100 includes lowering the heatsink lifter 50 in a lowered position, preventing insertion of the module 54 (step 102). The lowered position is the standard position of the heatsink lifter 50 for the port 18 whether or not there is a module 54 in the port 18. That is, the lowered position is standard when there is no module 54 present and when there is a module 54 present so that the TIM 62 can contact the module 54. The raised position is when there is an operation, either inserting or removing the module 54.

The optical module heatsink lifter process 100 includes raising the heatsink lifter 50, such as via pulling the knob 30 (step 104). Again, the heatsink lifter 50 maintains the raised position once the knob 30 is pulled out. Also, again, the operations in the optical module heatsink lifter process 100 are all front access, via the knob 30 and the port 18. The module 54 can be inserted in the port 18 (step 106). After the module 54 is inserted, the heatsink lifter 50 is lowered, via pushing the knob 30 on the faceplate 14 (step 108). Once in the lowered position with the module 54 included in the port 18, the heatsink 52 with the TIM 62 engages the module 54 with thermal coupling therebetween.

In an exemplary embodiment, the module heatsink lifter 50 for raising and lowering the heatsink 52 enabling insertion and removal of the module 54 includes the fixed base 56; the hinge connector 58 of the fixed based 56 coupled to the heatsink 52; and an actuator mechanism 30, 64, 66 to raise and lower the heatsink through rotation about the hinge connector 58, wherein the actuator mechanism 30, 64, 66 operates from a front faceplate 14 based on push and pull movement to raise and lower the heatsink 52 into a raised position and a lowered position. The actuator mechanism includes the knob 30 through the front faceplate 14 used for the push and pull movement.

The actuator mechanism includes the knob 30 coupled to lever arms 66 on both sides of the heatsink 52; linkage arms 64 rotatably coupling the lever arms 66 to the base 56, and springs 72 on the both sides providing tension between posts 74 and the heatsink 52. The actuator mechanism holds the heatsink 52 in the raised position without requiring a force on a knob 30 through the front faceplate 14 used for the push and pull movement. The module 54 can include a pluggable optical module.

When the heatsink 52 is in the lowered position, the heatsink 52 prevents insertion or removal of the module 54, and wherein the heatsink 52 is moved to the raised position for the insertion or removal of the module 54. The heatsink 52 includes Thermal Interface Material (TIM) 62 on a bottom portion which creates a thermal connection with the module 54 when the heatsink 52 is in the lowered position.

In another exemplary embodiment, a heatsink lifter method for raising and lowering a heatsink enabling insertion and removal of a module includes providing the fixed base 56; providing the hinge connector 58 of the fixed base 56 coupled to the heatsink 52; and providing an actuator mechanism 30, 64, 66 to raise and lower the heatsink 52 through rotation about the hinge connector 58, wherein the actuator mechanism 30, 64, 66 operates from a front faceplate 14 based on push and pull movement to raise and lower the heatsink 52 into a raised position and a lowered position.

In a further exemplary embodiment, the network element 10 supporting one or more pluggable modules 54 includes the physical housing 12 including the front faceplate 14; one or more ports 18 on the front faceplate 14; and a heatsink lifter 50 for each of the one or more ports 18, wherein the heatsink lifter 50 includes the fixed base 56; the hinge connector 58 of the fixed based 56 coupled to the heatsink 52; and an actuator mechanism 30, 64, 66 to raise and lower the heatsink through rotation about the hinge connector 58, wherein the actuator mechanism 30, 64, 66 operates from a front faceplate 14 based on push and pull movement to raise and lower the heatsink 52 into a raised position and a lowered position.

The module heatsink lifter 50 is relatively compact and does not take up much extra space on the PCB where the port 18 and the module 54 interconnections occur. Also, the knob 30 is easy to use—only two positions—in and out. The out position clearly can be seen that the module heatsink lifter 50 is raised.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A module heatsink lifter for raising and lowering a heatsink enabling insertion and removal of a module, the module heatsink lifter comprising:
   a fixed base;
   a hinge connector of the fixed based coupled to the heatsink; and
   an actuator mechanism to raise and lower the heatsink through rotation about the hinge connector, wherein the actuator mechanism operates from a front faceplate based on push and pull movement to raise and lower the heatsink into a raised position relative to the module and a lowered position relative to the module, wherein the heatsink is rotatably lowered onto the module making substantial contact with a Thermal Interface Material (TIM) between the module and the heatsink, based on push and pull movement via the actuator mechanism.

2. The module heatsink lifter of claim 1, wherein the actuator mechanism comprises a knob through the front faceplate.

3. The module heatsink lifter of claim 1, wherein the actuator mechanism comprises:
a knob coupled to lever arms on both sides of the heatsink;
linkage arms rotatably coupling the lever arms to the base; and
springs on the both sides providing tension between posts and the heatsink.

4. The module heatsink lifter of claim 1, wherein the actuator mechanism holds the heatsink in the raised position without requiring a force on a knob through the front faceplate used for the push and pull movement.

5. The module heatsink lifter of claim 1, wherein the module comprises a pluggable optical module.

6. The module heatsink lifter of claim 1, wherein, when the heatsink is in the lowered position, the heatsink prevents insertion or removal of the module, and wherein the heatsink is moved to the raised position for the insertion or removal of the module.

7. The module heatsink lifter of claim 1, wherein the heatsink comprises the Thermal Interface Material (TIM) on a bottom portion which creates a thermal connection with the module when the heatsink is in the lowered position.

8. A heatsink lifter method for raising and lowering a heatsink enabling insertion and removal of a module, the heatsink lifter method comprising:
providing a fixed base;
providing a hinge connector of the fixed based coupled to the heatsink; and
providing an actuator mechanism to raise and lower the heatsink through rotation about the hinge connector, wherein the actuator mechanism operates from a front faceplate based on push and pull movement to raise and lower the heatsink into a raised position relative to the module and a lowered position relative to the module, wherein the heatsink is rotatably lowered onto the module making substantial contact with a Thermal Interface Material (TIM) between the module and the heatsink, based on push and pull movement via the actuator mechanism.

9. The heatsink lifter method of claim 8, wherein the actuator mechanism comprises a knob through the front faceplate.

10. The heatsink lifter method of claim 8, wherein the actuator mechanism comprises:
a knob coupled to lever arms on both sides of the heatsink;
linkage arms rotatably coupling the lever arms to the base; and
springs on the both sides providing tension between posts and the heatsink.

11. The heatsink lifter method of claim 8, wherein the actuator mechanism holds the heatsink in the raised position without requiring a force on a knob through the front faceplate used for the push and pull movement.

12. The heatsink lifter method of claim 8, wherein the module comprises a pluggable optical module.

13. The heatsink lifter method of claim 8, wherein, when the heatsink is in the lowered position, the heatsink prevents insertion or removal of the module, and wherein the heatsink is moved to the raised position for the insertion or removal of the module.

14. The heatsink lifter method of claim 8, wherein the heatsink comprises the Thermal Interface Material (TIM) on a bottom portion which creates a thermal connection with the module when the heatsink is in the lowered position.

15. A network element supporting one or more pluggable modules, the network element comprising:
a physical housing comprising a front faceplate;
one or more ports on the front faceplate; and
a heatsink lifter for each of the one or more ports, wherein the heatsink lifter comprises
a fixed base,
a hinge connector of the fixed based coupled to the heatsink, and
an actuator mechanism to raise and lower the heatsink through rotation about the hinge connector, wherein the actuator mechanism operates from the front faceplate based on push and pull movement to raise and lower the heatsink into a raised position relative to the module and a lowered position relative to the module, wherein the heatsink is rotatably lowered onto the module making substantial contact with a Thermal Interface Material (TIM) between the module and the heatsink, based on push and pull movement via the actuator mechanism.

16. The network element of claim 15, wherein the actuator mechanism comprises a knob through the front faceplate.

17. The network element of claim 15, wherein the actuator mechanism comprises:
a knob coupled to lever arms on both sides of the heatsink;
linkage arms rotatably coupling the lever arms to the base; and
springs on the both sides providing tension between posts and the heatsink.

18. The network element of claim 15, wherein the module comprises a pluggable optical module.

19. The network element of claim 15, wherein, when the heatsink is in the lowered position, the heatsink prevents insertion or removal of the module, and wherein the heatsink is moved to the raised position for the insertion or removal of the module.

20. The network element of claim 15, wherein the heatsink comprises the Thermal Interface Material (TIM) on a bottom portion which creates a thermal connection with the module when the heatsink is in the lowered position.

* * * * *